United States Patent [19]

Jillie, Jr. et al.

[11] 4,430,662

[45] Feb. 7, 1984

[54] SUPERCONDUCTIVE TUNNEL JUNCTION INTEGRATED CIRCUIT

[75] Inventors: Don W. Jillie, Jr., Arlington; Lawrence N. Smith, Lexington, both of Mass.

[73] Assignee: Sperry Corporation, New York, N.Y.

[21] Appl. No.: 252,528

[22] Filed: Apr. 9, 1981

[51] Int. Cl.³ .................... H01L 39/22; H01L 27/12
[52] U.S. Cl. ............................................ 357/5; 357/4
[58] Field of Search ...................... 357/5, 4; 307/306

[56] References Cited

U.S. PATENT DOCUMENTS

| | | | |
|---|---|---|---|
| 4,117,503 | 9/1978 | Zappe | 307/306 X |
| 4,220,959 | 9/1980 | Kroger | 357/5 |
| 4,315,255 | 2/1982 | Harris | 307/306 X |

OTHER PUBLICATIONS

T. R. Gheewala "Design of 2.5-Micrometer Josephson Current Injection Logic (CIL)" *IBM J. Res. & Develop.*, vol. 24, No. 2, pp. 130-142, Mar. 1980.

*Primary Examiner*—Martin H. Edlow
*Assistant Examiner*—J. L. Badgett
*Attorney, Agent, or Firm*—Howard P. Terry; Albert B. Cooper

[57] ABSTRACT

Josephson junction integrated circuits of the current injection type and magnetically controlled type utilize a superconductive layer that forms both Josephson junction electrode for the Josephson junction devices on the integrated circuit as well as a ground plane for the integrated circuit. Large area Josephson junctions are utilized for effecting contact to lower superconductive layers and islands are formed in superconductive layers to provide isolation between the groundplane function and the Josephson junction electrode function as well as to effect crossovers. A superconductor-barrier-superconductor trilayer patterned by local anodization is also utilized with additional layers formed thereover. Methods of manufacturing the embodiments of the invention are disclosed.

30 Claims, 14 Drawing Figures

- 1 — $S_1$ LOWER ELECTRODE, INTERCONNECTS
- 2 — $I_1$ CROSSOVER INSULATION
- 3 — B JOSEPHSON BARRIER
- 4 — $S_2$ JOSEPHSON UPPER ELECTRODE, INTERCONNECTS
- 5 — R RESISTORS
- 6 — $I_2$ GROUNDPLANE INSULATOR
- 7 — $S_3$ GROUNDPLANE

|  |  |
|---|---|
| ——————— | 1-S₁ SUPERCONDUCTOR |
| ☐ | 2-I INSULATOR |
| —·—·— | 3-R RESISTOR |
| ▦ | 4-B BARRIER |
| — — — — | 5-S SUPERCONDUCTOR |

|  | 1 | $S_1$ | GROUNDPLANE |
|---|---|---|---|
|  | 2 | $I_1$ | OPENINGS IN INSULATOR |
|  | 3 | $R_1$ | RESISTOR PATTERN |
|  | 4 | B | BARRIER |
|  | 5 | S | SECOND SUPERCONDUCTOR PATTERN |
|  | 6 | $I_2$ | INSULATOR UNPATTERNED EXCEPT OVER CONTACT |
|  | 7 | $S_3$ | SUPERCONDUCTOR USED AS FLUX SHIELD |

SUPERCONDUCTIVE TUNNEL JUNCTION INTEGRATED CIRCUIT

BACKGROUND OF THE INVENTION

1. Field of the Invention

The invention relates generally to integrated circuits particularly with respect to Superconductive Tunnel junction integrated circuits. The invention will be described particularly with respect to Josephson circuits.

2. Description of the Prior Art

A primary factor determining the efficacy of integrated circuit processes and the concomitant yield thereof is the number of steps comprising the process. For example, if a process consists of twelve steps and the expected yield of each of the steps is seventy-five percent, then the yield of operative devices at the completion of the twelve step process is $0.75^{12}$, or approximately three percent. Generally, this yield is considered unacceptably low. If, however, the process consists of eight steps, each with a yield probability of seventy-five percent, then the final yield for the eight step process is $0.75^8$, or ten percent. Thus by eliminating four steps, a three-fold improvement in yield is achieved without any improvement in the quality of the processing. Additionally, large numbers of processing steps engender problems with adhesion, step coverage and damage to prior deposited layers. The longer the fabrication sequence, the lower is the device throughput of the process.

The current state of the art of Josephson junction integrated circuit fabrication is discussed in an article by J. H. Greiner et al entitled "Fabrication Process for Josephson Integrated Circuits", published in the March, 1980 issue of the IBM Journal of Research and Development, Volume 24, No. 2, on page 195 (Reference 1) and in an article by T. R. Gheewala entitled "Design of 2.5-Micrometer Josephson Current Injection Logic (CIL)", published in the March, 1980 issue of the IBM Journal of Research and Development, Volume 24, No. 2 on page 130 (Reference 2). Said References 1 and 2 are incorporated herein by reference. As discussed in said Reference 1, the state of the art of Josephson junction logic integrated circuit fabrication involves approximately 12 deposition steps, 12 photoresist steps, an anodization step and a junction barrier formation step. Table 1 on page 197 of said Reference 1 enumerates the steps for a particular process utilized to fabricate interferometers combined with current injection logic gates. Typically the process comprises depositing four superconducting layers, viz., the ground plane, the lower Josephson electrode, the Josephson counter electrode and the control lines. Interconnections, interferometer loops and other circuit elements are formed from the last three layers. Each superconductive layer is separated from an adjacent superconductive layer by an insulator layer that is patterned to form vias which provide required electrical connections between layers. The deposition of resistors, additional insulator layers for increased inductance, passivation layers and anodization are steps utilized to complete the circuit. Thus it is appreciated that a minimum of nine separate thin films and patterning steps are required in this process. In the fabrication procedure depicted by Table 1 on page 197 of said Reference 1, fifteen layers are utilized. In the art of semiconductor integrated circuit fabrication, there are considered excessive numbers of steps resulting in unacceptably low yields of functional circuits and inordinately long times for circuit fabrication completion.

There are two basic types of Josephson logic gates, viz., current injection gates and magnetically controlled gates. All present day Josephson integrated circuits utilize one or both of these gate types. The fastest logic gates utilize a combination of the two as described in said Reference 2. All of these types of Josephson integrated circuits are subject to the disadvantages described above.

SUMMARY OF THE INVENTION

The present invention obviates the disadvantages of the prior art by fabricating a Josephson junction integrated circuit comprising a first layer of superconductive material, a second layer of superconductive material superposed with respect to the first layer and a Josephson tunneling barrier between the first and second layers, one of the first and second layers forming a Josephson junction electrode with respect to the barrier and a ground plane for the integrated circuit. This basic arrangement is utilized in fabricating magnetically controlled logic and current injection logic as well as combinations of the two. Various individual techniques are employed in fabricating the various circuit types, the techniques to be discussed in detail hereinbelow. Additionally, the invention is utilized with the local anodization procedure disclosed in copending U.S. application Ser. No. 179,311, filed Aug. 18, 1980 for "Josephson Tunnel Junction Device and Method of Manufacture" by Harry Kroger and assigned to the assignee of the present application. Said Ser. No. 179,311 is incorporated herein by reference.

BRIEF DESCRIPTION OF THE DRAWINGS

FIG. 1A is a cross section of the integrated circuit of FIG. 1 taken along line 1a.

DESCRIPTION OF THE PREFERRED EMBODIMENTS

As discussed above, the present invention may be utilized with respect to Josephson junction integrated circuits of the current injection logic type and of the magnetically controlled logic type which utilizes magnetically coupled control lines. The embodiments of the invention illustrated in FIGS. 2 and 3 find primary utility in manufacturing current injection logic integrated circuits whereas the embodiments of FIGS. 4, 5 and 6 find primary utility with respect to magnetically controlled integrated circuits and those utilizing both types of logic. Josephson logic gates that operate on the principal of current injection include the asymmetric injection gate, the Josephson Attoweber switch (JAWS) and direct coupled logic (DCL).

The layers and steps utilized in fabricating Josephson junction current injection logic integrated circuits in the prior art are summarized as follows:

TABLE 1

| Layer | Material | Function |
|---|---|---|
| $S_1$ | Pb alloy, 2500 Å | Form lower Josephson electrodes, interconnects |
| $I_1$ | GeO, 2000 Å SiO, 2000 Å | Crossover insulation |
| B | Oxidation $S_1$ | Form Josephson tunneling barrier |
| $S_2$ | Pb alloy, 2500 Å | Form Josephson upper electrodes, interconnects |
| $R_1$ | CuGe alloy, variable thickness | Form circuit resistors |
| $I_2$ | GeO, 2000 Å SiO, 2000 Å | Form groundplane insulation |
| $S_3$ | Pb alloy, 2500 Å | Form groundplane |

It will be appreciated with respect to layer $S_3$ that alternatively the ground plane and groundplane insulator can be deposited before the deposition of layer $S_1$. This alternative construction is utilized if matching capacitors are required in the circuit design.

Figure 1:
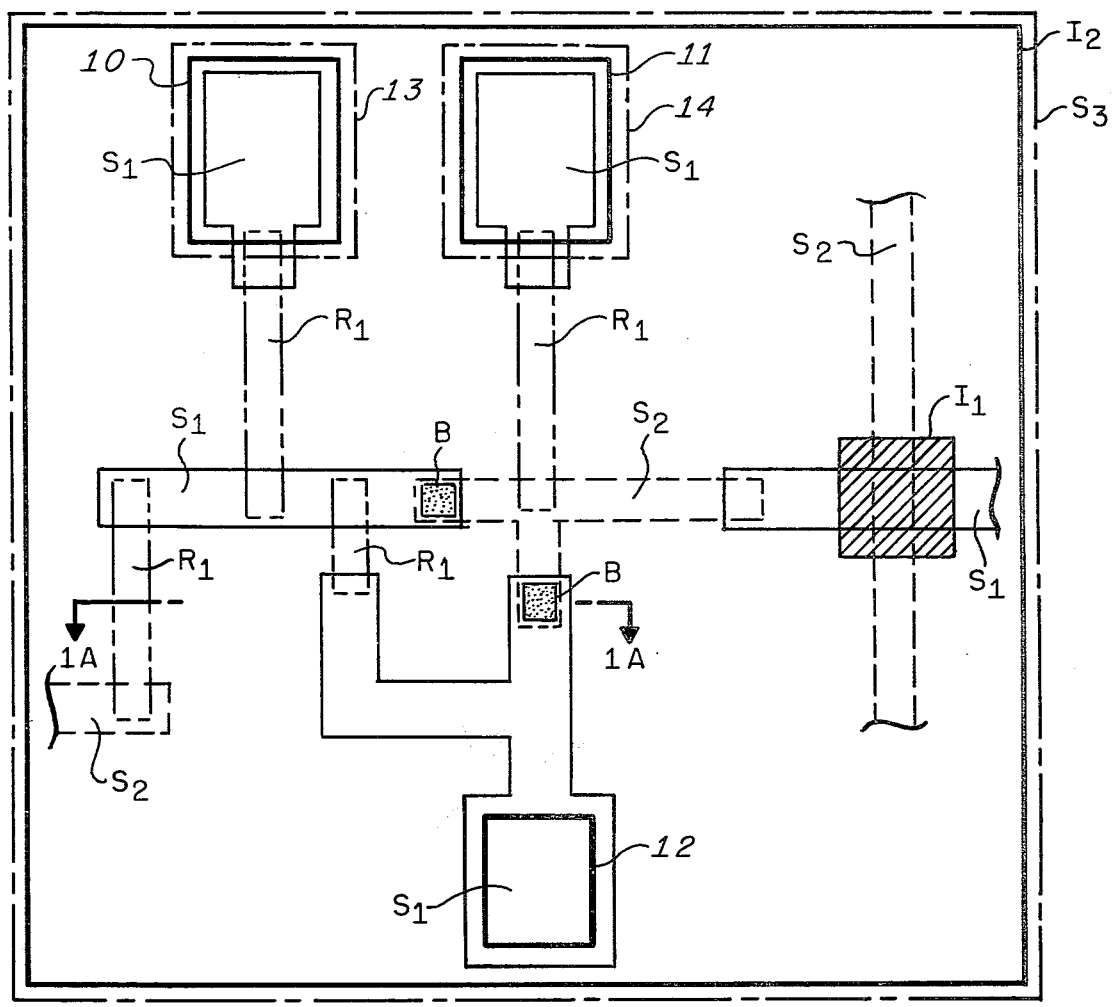
FIG. 1 is a schematic representation of the layers and steps utilized in fabricating a Josephson Attoweber switch (JAWS) gate in accordance with the prior art.
Figure 1A:
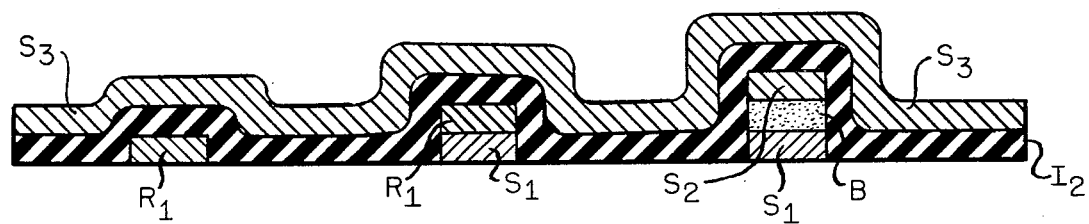
Figure 2A:
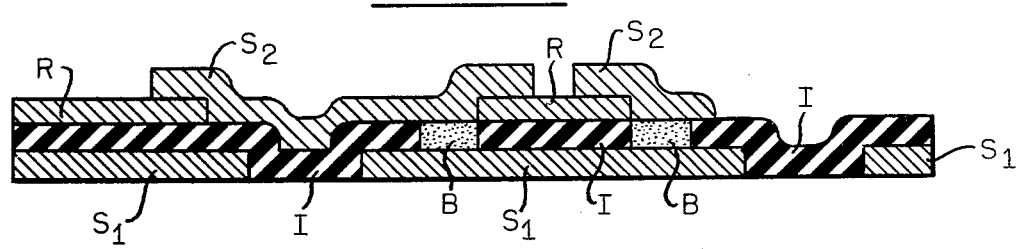
FIG. 2a is a cross section of the integrated circuit of FIG. 2 taken along line 2A.

Referring to FIG. 1, the patterning steps utilized in the prior art for fabricating a JAWS gate employing the layers of Table 1 are illustrated. The JAWS-type gate is disclosed by way of example, the fabrication thereof being representative of any current injection type gate. Although the common lead alloy based technology is disclosed in the example of FIG. 1, it is appreciated that other materials may be substituted as appropriate, such as niobium instead of lead alloy or $SiO_2$ instead of SiO or GeO. The letters corresponding to the numbered steps refer to the similarly designated layers delineated in Table 1. FIG. 1a is a schematic wiring diagram of the JAWS integrated circuit of FIG. 1.

The various deposition and patterning steps of the process delineated in Table 1 and illustrated in FIG. 1 may utilize lift-off processing. In lift-off processing an undercut photoresist mask is fabricated utilizing any one of numerous well known techniques. The desired material is deposited through the mask and the mask with the overlying material is lifted off utilizing a suitable solvent. Alternatively the fabrication may utilize subtractive etching provided that an unetchable passivated surface is included beneath the layer being etched.

The process of manufacturing the JAWS gate of FIG. 1 in accordance with the prior art configuration and procedure begins by depositing and patterning a layer $S_1$ to form the lower Josephson junction electrode and various interconnecting lines as required. The electrodes and lines denoted as $S_1$ by the legend are deposited on a suitable substrate. The various areas encompassed by the lines denoted as $S_1$ comprise the deposited contact pads, junction electrodes and leads as illustrated. The second step in the prior art process is to deposit patches of insulation at various crossover points as required to insulate elements of the $S_1$ layer from a subsequently deposited $S_2$ layer. Such a patch of insulator is depicted as $I_1$. The third step constitutes forming the Josephson tunneling barriers, for example, by the oxidation of the associated surfaces of $S_1$. Alternatively when, for example, $S_1$ comprises niobium, an amorphous or polysilicon semiconductor may be deposited to form the barriers as indicated by the legend. Two such barrier formations are illustrated at B.

The $S_2$ superconductive layer is then deposited forming the upper Josephson junction electrodes and other required interconnections. It is appreciated that at the areas denoted as B, Josephson tunneling junctions are formed by the $S_1$-B-$S_2$ superposed layers. The fifth step of the prior art process comprises depositing or otherwise forming the resistors as the $R_1$ layer as indicated by the legends. During the sixth step of the process the insulator layer $I_2$ is deposited and via openings formed in areas where contact to the layers $S_1$ or $S_2$ is required. For example, via openings 10, 11 and 12 in the $I_2$ layer are utilized for contacting the $S_1$ layer. As will be appreciated from further steps to be described, the via openings 10 and 11 permit contact to the underlying $S_1$ pads by external contacts while the via opening 12 is utilized for contact to the underlying $S_1$ pad by the subsequently deposited groundplane.

The final seventh step of the process is the deposition of the $S_3$ groundplane layer with contact vias 13 and 14 patterned out. The purpose of the groundplane is to reduce the inductance of the various lines formed in $S_1$ and $S_2$ which results in faster circuit operation. Thus fully functional high performance chips require the layers $I_2$ and $S_3$.

It is appreciated that to fabricate the JAWS gate illustrated in FIG. 1, the prior art requires seven deposition and patterning steps. It is furthermore appreciated that the integrated circuit chip of FIG. 1 implements the schematically illustrated circuit of FIG. 1A.

Figure 2:
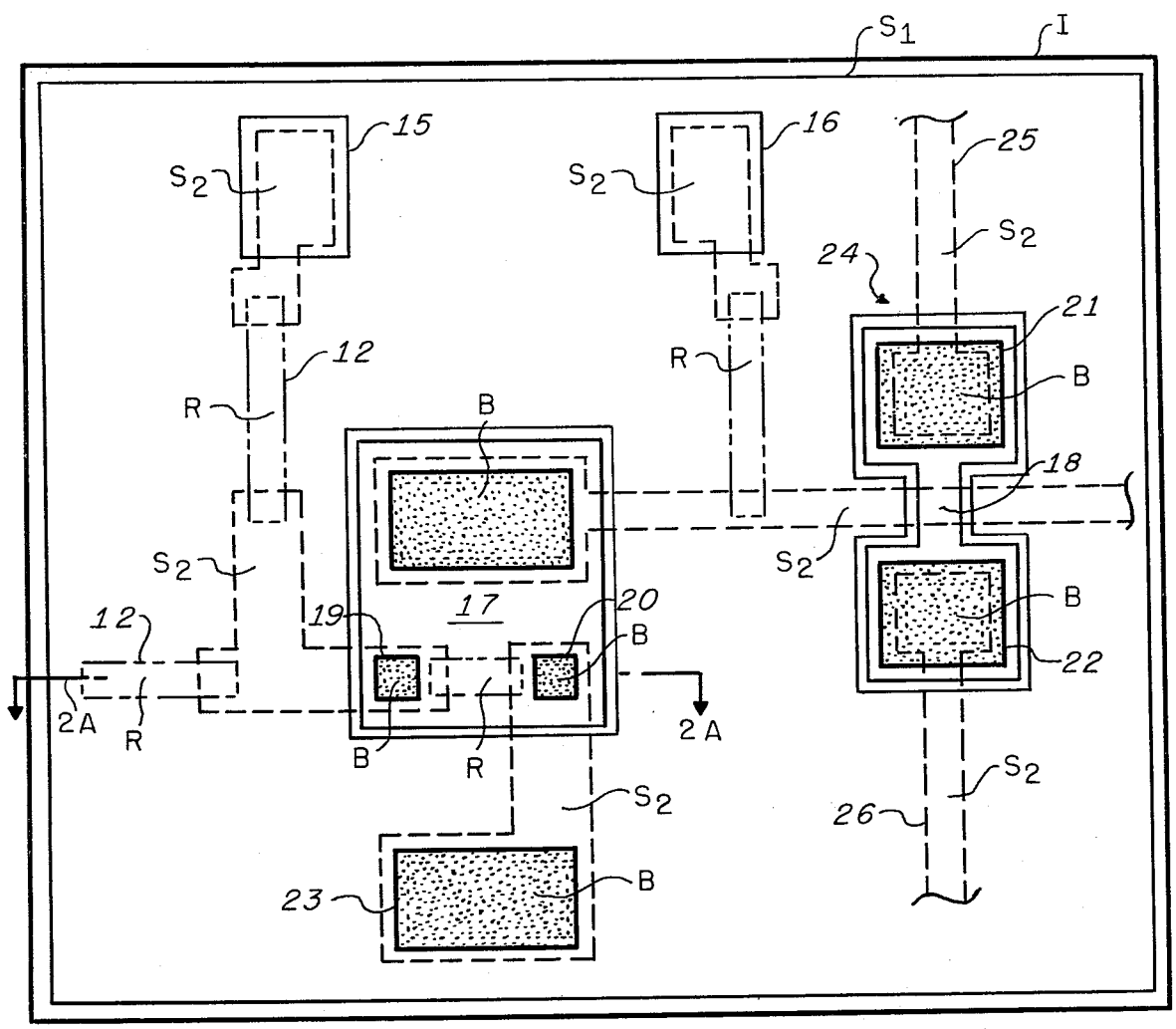
FIG. 2 is a schematic representation of the layers and steps utilized in fabricating the JAWS gate of FIG. 1A in accordance with the present invention. A method of forming crossovers is illustrated.

Referring to FIG. 2, the JAWS gate of FIG. 1A configured and fabricated in accordance with the present invention is illustrated. The JAWS gate of FIG. 2 is representative of current injection logic circuits that may be implemented in accordance with the invention. The layers and steps utilized in such a fabrication process are summarized as follows:

TABLE 2

| Layer | Material | Function |
|---|---|---|
| $S_1$ | Superconductor, 2000 Å | Groundplane/Josephson lower electrode |
| I | Insulator, 2000 Å | Groundplane insulator/junction definition |
| R | Resistive metal 1000 Å | Resistors |
| B | Thin oxide(30–100) Å semiconductor | Josephson Tunneling barrier |
| $S_2$ | Superconductor | Strip transmission lines, |

TABLE 2-continued

| Layer | Material | Function |
|---|---|---|
| | 3000 Å | interconnects |

The circuit of FIG. 2 may be implemented utilizing materials, patterning techniques and methods for Josephson barrier formation already in use in the art of Josephson circuit fabrication. These materials, for example, may be those delineated in Table 1 above with the method of patterning being lift-off photoresist as discussed. Alternative materials such as niobium, hydrogenated silicon, silicon dioxide and molybdenum may be utilized for the superconductive elements, tunneling barriers, insulators and resistors, respectively. Alternatively patterning may be achieved by subtractive etching or E-beam lithography. If niobium is utilized for the $S_1$ layer, $S_1$ may be anodized selectively either to replace I or to provide two insulator layers thus achieving flexibility with respect to fabricating capacitors and interconnects. It will be appreciated that the letter designations provided in the legend of FIG. 2 refer to the layers delineated in Table 2 above.

The first step in the Josephson junction circuit fabrication process in accordance with the invention comprises deposition and patterning of the superconductive layer $S_1$. The $S_1$ layer functions as the Josephson junction lower electrode and as the groundplane for the circuit. Islands are formed in the $S_1$ layer to isolate junctions that are not directly connected to ground and to isolate regions that will become crossovers. The $S_1$ layer is removed in areas where contact pads to the upper superconductor are to be located so as to prevent inadvertent shorting between the contact pads and the groundplane $S_1$ due to the mechanical pressures applied to the contact pads in making external connection thereto. For example, the $S_1$ layer is removed within the rectangles 15 and 16 and islands 17 and 18 are formed in the $S_1$ layer. Island 17 is utilized to isolate the Josephson junctions forming the JAWS gate from the groundplane $S_1$ whereas the island 18 is formed to provide a crossover.

The second step of the process in accordance with the invention is the deposition and patterning of an insulator layer I. The I layer is patterned to form the Josephson openings for the JAWS gate and also to form large area openings for providing large area Josephson junctions for contact to the islands 17 and 18. Large area openings in the I layer are also required where contact to the groundplane $S_1$ is desired. For example, openings 19 and 20 in the I layer are utilized as the openings for the small area Josephson junctions of the JAWS gate. Vias 21 and 22 in the I layer provide the requisite openings for a crossover and the via 23 provides for contact to the groundplane portion of the layer $S_1$.

The third step in the process is the deposition of the resistors R on the I layer. In the present invention, resistors may be deposited exclusively on planar areas thus avoiding step coverage problems sometimes prevalent in prior art circuits and processes. This provision is significant since it is often necessary to make the resistors thin to obtain the required resistivity values. The Josephson barriers are now formed in the I layer vias 19–23, for example, by oxidizing the underlying $S_1$ layer. The upper superconductive layer $S_2$ is deposited and patterned thus forming the Josephson junction upper electrodes, strip transmission line interconnects and contact pads.

The barriers formed in the vias 19 and 20 provide the small area Josephson junctions that form the JAWS element itself. The barriers in the vias 21, 22 and 23 provide large area Josephson junctions through which contact is made from the $S_2$ layer to the $S_1$ layer. The large area Josephson junctions must have sufficient critical current to remain at zero voltage at all required current loadings so as to effect the desired zero resistance contacts between the layers. Thus, it is appreciated that utilizing this procedure increases circuit area requirements to provide the requisite critical current for this function. Since the inductance associated with a Josephson junction varies in inverse proportion to its critical current, the additional inductance of the large area junctions will be small compared to the inductance associated with the small junctions and will have negligible effect on the operating speed of the circuit.

The circuit arrangement and process for forming a crossover in the $S_2$ layer is illustrated at 24. Leads 25 and 26 in the $S_2$ layer make contact to the island 18 in the $S_1$ layer via the large area Josephson junctions formed by the vias 21 and 22, respectively, since the areas of these junctions in the vias 21 and 22 are such as to have sufficient critical current to remain at zero voltage for all current loadings of the circuit. Thus, in operation, a zero resistance path exists between the leads 25 and 26 through the island 18 which is insulated from the traversing lead of $S_2$. This crossover configuration suffers from an area penalty and a small penalty in performance due to the increased inducatance. The performance, however, may be restored by fabricating matching capacitors to effect an impedance match with respect to the spurious inductance thus involving an additional step in the fabrication. This additional step may or may not be required depending on the refinement of the circuit design in which the crossover procedure is utilized.

It is appreciated from the foregoing that in practicing the present invention in fabricating Josephson junction current injection logic integrated circuit chips only five deposition and patterning steps are required. The resulting circuit is substantially identical to the circuits of chips (such as that of FIG. 1) fabricated utilizing prior art arrangements and processes, which prior art arrangements and processes require seven deposition steps and seven patterning steps.

Figure 3A:
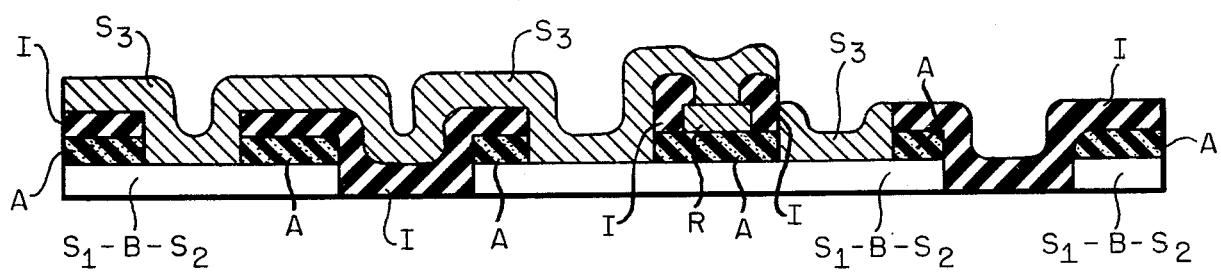
FIG. 3A is a cross section of the integrated circuit of FIG. 3 taken along line 3A.
Figure 3:
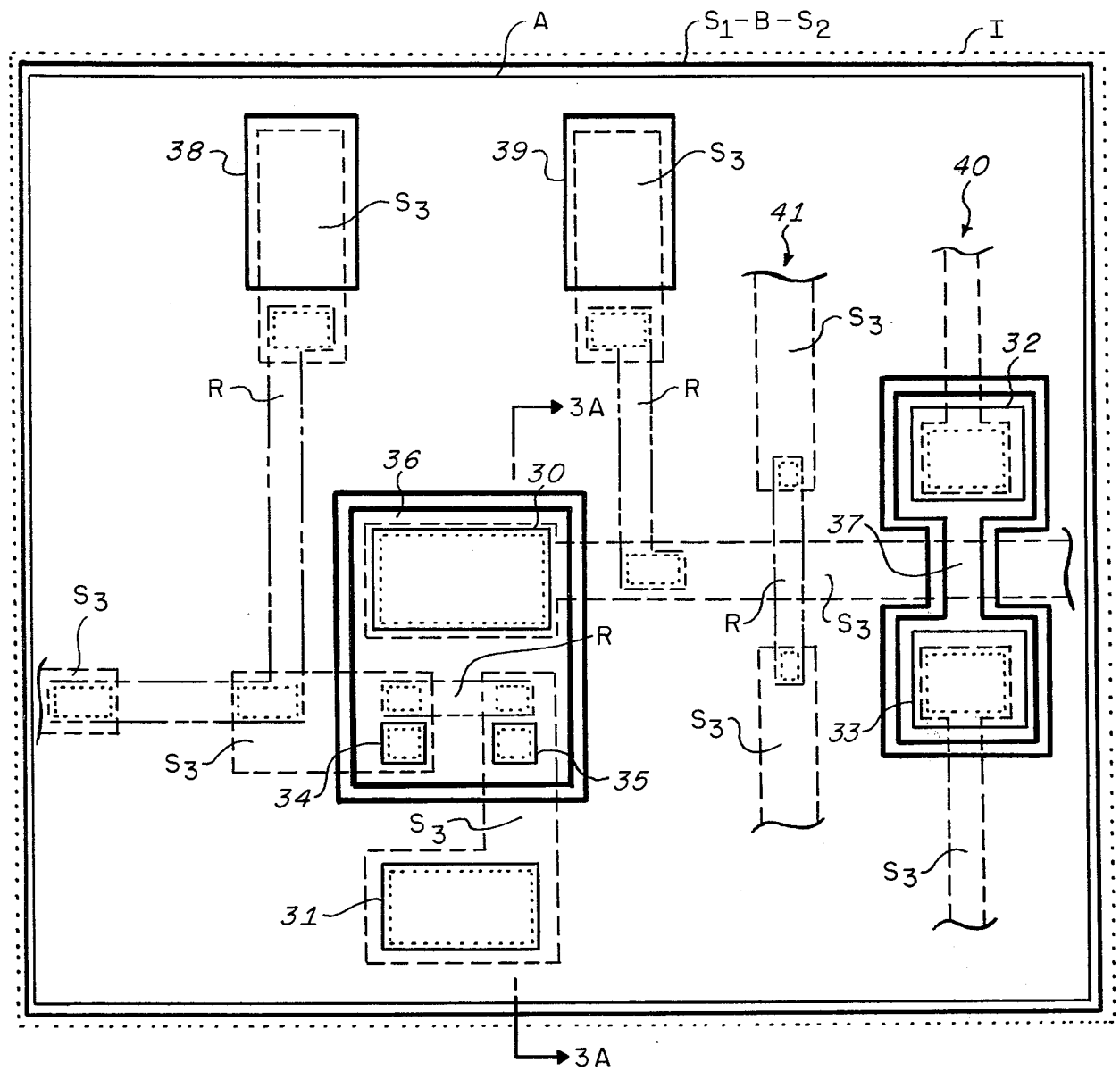
FIG. 3 is a schematic representation of the layers and the steps utilized in fabricating a JAWS gate in accordance with the present invention employing the local anodization technique of said Ser. No. 179,311 for Josephson junction definition. Two methods of forming crossovers are illustrated.

Referring to FIG. 3, a JAWS gate integrated circuit configured and fabricated in accordance with the present invention and utilizing the local anodization technique of said Ser. No. 179,311 is illustrated. The schematic wiring diagram for the integrated circuit of FIG. 3 is illustrated in FIG. 3A. The steps and layers utilized in fabricating Josephson junction current injection logic integrated circuits such as that of FIG. 3 in accordance with the present invention and utilizing the local anodization technique is summarized as follows:

TABLE 3

| Layer | Material | Function |
|---|---|---|
| $S_1$ | Niobium (3000 Å) | Josephson lower electrode/groundplane |
| B | Oxide, semiconductor (30–100 Å) | Tunneling barrier |
| $S_2$ | Niobium (200–600 Å) | Josephson upper electrode |
| A | Anodized niobium (600–1800) Å | Groundplane insulator junction definition |
| R | Molybdenum, 800 Å | Resistors |

TABLE 3-continued

| Layer | Material | Function |
|---|---|---|
| I | SiO$_2$, 2500 Å | Added groundplane insulator/edge insulator |
| S$_3$ | Niobium, 3000 Å | Strip transmission lines, interconnects |

The first three layers S$_1$-B-S$_2$ are provided in accordance with the local anodization technique, the steps associated therewith being concluded without intervening photolithography or other processing. With respect to the layer R, materials other than molybdenum may also be suitable for fabricating the resistors. The letter designations set forth in the legend of FIG. 3 refer to the layers delineated in Table 3.

The local anodization technique for junction definition is fully described in said Ser. No. 179,311. Briefly, a layer of niobium, for example, 3,000 Angstrom units thick, is deposited followed by Josephson barrier formation. The Josephson barrier may be formed either by oxidizing the first layer of niobium or by depositing a barrier material. A second layer of niobium is then deposited over the barrier to a thickness, of for example, 200 to 600 Angstrom units. The resulting structure constitutes a Josephson junction covering the entire substrate area. In the present application, the lower niobium layer is denoted as S$_1$, the barrier as B and the upper layer as S$_2$ forming the trilayer structure S$_1$-B-S$_2$. The lower layer forms the Josephson lower electrodes and the upper layer forms the Josephson counter electrodes. In accordance with the present invention, the lower layer S$_1$ is also utilized as the ground plane for the structure. Individual small area junctions are then defined by forming a photoresist mask over those regions to be utilized as junctions and anodizing the entire upper niobium layer to completion. The anodized area of the upper layer thus completely replaces the upper niobium material by insulation. Those regions covered by the photoresist mask are not anodized and thus retain the junctions located thereat. Thus, the junctions for the circuit are defined and the surrounding region covered by a layer of high quality, pinhole-free insulation all in one step.

The steps and patterns utilized to incorporate the local anodization technique of said Ser. No. 179,311 into the present process with respect to the fabrication of a JAWS circuit are delineated in Table 3 above and depicted in FIG. 3. The trilayer S$_1$-B-S$_2$ is deposited, masked and anodized in accordance with step 1. During the step of anodizing the S$_2$ layer, the Josephson junctions for the JAWS device as well as the large area junctions required for contact with the layer S$_1$ are formed. In step 2 of the process, the trilayer S$_1$-B-S$_2$ is patterned to form islands therein as required for the Josephson junctions of the JAWS gate as well as for effecting interconnections. Additionally, the trilayer is removed under any bonding pads subsequently to be deposited with the S$_3$ layer. The trilayer is removed under the bonding pads to avoid shorting to the groundplane as discussed above with respect to FIG. 2. Thus, the anodization of the S$_2$ layer forms large area Josephson junctions 30, 31, 32 and 33 as well as the small area Josephson junctions 34 and 35 which form the elements of the JAWS gate. During step 2, islands 36 and 37 are delineated in the trilayer S$_1$-B-S$_2$ and the trilayer is removed within the rectangles 38 and 39. The large area Josephson junction 30 is utilized for effecting contact with the S$_1$ layer of the island 36, and the large area junctions 32 and 33 are utilized for effecting contact with the S$_1$ layer of the island 37. The large area Josephson junction 31 is utilized for making contact to the groundplane portion of the S$_1$ islands 36 and 37 are formed completely through the trilayer. It is further appreciated that the entire trilayer is removed from the rectangles 38 and 39.

During step 3 of the procedure, the resistor material is deposited and patterned as indicated by the resistors R of FIG. 3. Since the resistors are all formed on a planar surface, they can be relatively thin without encountering the step coverage problems sometimes prevalent with prior art procedures. In step 4 of the process, a layer I of insulation is deposited and via openings patterned therein as illustrated. The vias in the layer I are utilized for contacting the Josephson junctions formed in the trilayer S$_1$-B-S$_2$ by the subsequently deposited layer S$_3$ and to contact the resistors R by the S$_3$ layer. The I layer also insulates the exposed edges of the islands 36 and 37 and insulates the resistors R. The I layer permits additional flexibility in control of circuit capacitance and inductance and in particular the strip transmission line impedance of the S$_3$ layer is partially determined by the thickness of the layer I. Furthermore, by cutting holes in the layer I underneath S$_3$, matching capacitors may be fabricated without additional steps. The circuit is completed by depositing and patterning the superconductive layer S$_3$ as illustrated. The S$_3$ layer provides contacts to all of the Josephson junctions, interconnecting strip transmission lines and crossovers.

A crossover 40 is provided on the chip illustrated in FIG. 3 and is effected in a manner similar to that described with respect to the crossover 24 of FIG. 2. When utilizing the local anodization technique, an additional means to fabricate crossovers is provided. Since the resistors R are sandwiched between the anodized layer S$_2$ and the insulator layer I, they may be utilized to provide crossover points. One such arrangement is indicated at 41. It is appreciated that the crossover utilizing the resistor consumes less area than the crossover utilizing the technique embodied by the crossover 40. Further circuit compactness may be achieved by situating resistors R underneath strip transmission lines S$_3$. This arrangement would, however, degrade the transmission line characteristics of the strip transmission lines by adding dissipation.

The above-described embodiments of the invention are particularly applicable to current injection logic circuits. The present invention is also applicable to magnetically controlled logic as well as the combination of magnetically controlled logic and current injection logic. Further embodiments of the invention with respect to magnetically controlled logic and the combination of magnetically controlled logic and current injection logic will be described hereinbelow with respect to, for example, a 1:2:1 interferometer and an asymmetric 2-junction injection gate, the 1:2:1 interferometer comprising a magnetically controlled gate.

These two gates are typical of the two types of gates extant and additionally provide the highest performance gate combination in present day Josephson junction circuitry. It is appreciated that all other gates of the two basic types may be constructed by utilizing readily apparent alterations of the techniques disclosed herein. Such gates include the JAWS gate described above, DCL gates and two-junction interferometers. Josephson microcircuits are typically constructed utilizing one or both of two different superconductors such as niobium and lead alloys. The techniques of the present invention described herein are applicable to both materials, the basic concepts of the invention being applicable to more general circuits than the particular embodiments described. As discussed, the invention may also be utilized in conjunction with niobium junctions formed utilizing the local anodization technique of said Ser. No. 179,311.

Figure 6A:
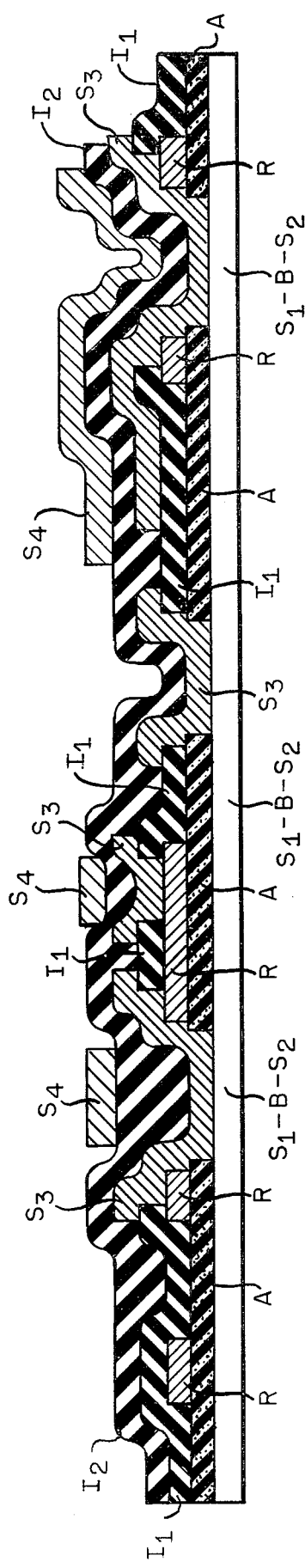
FIG. 6A is a cross section of the integrated circuit of FIG. 6 taken along line 6A.
Figure 6:
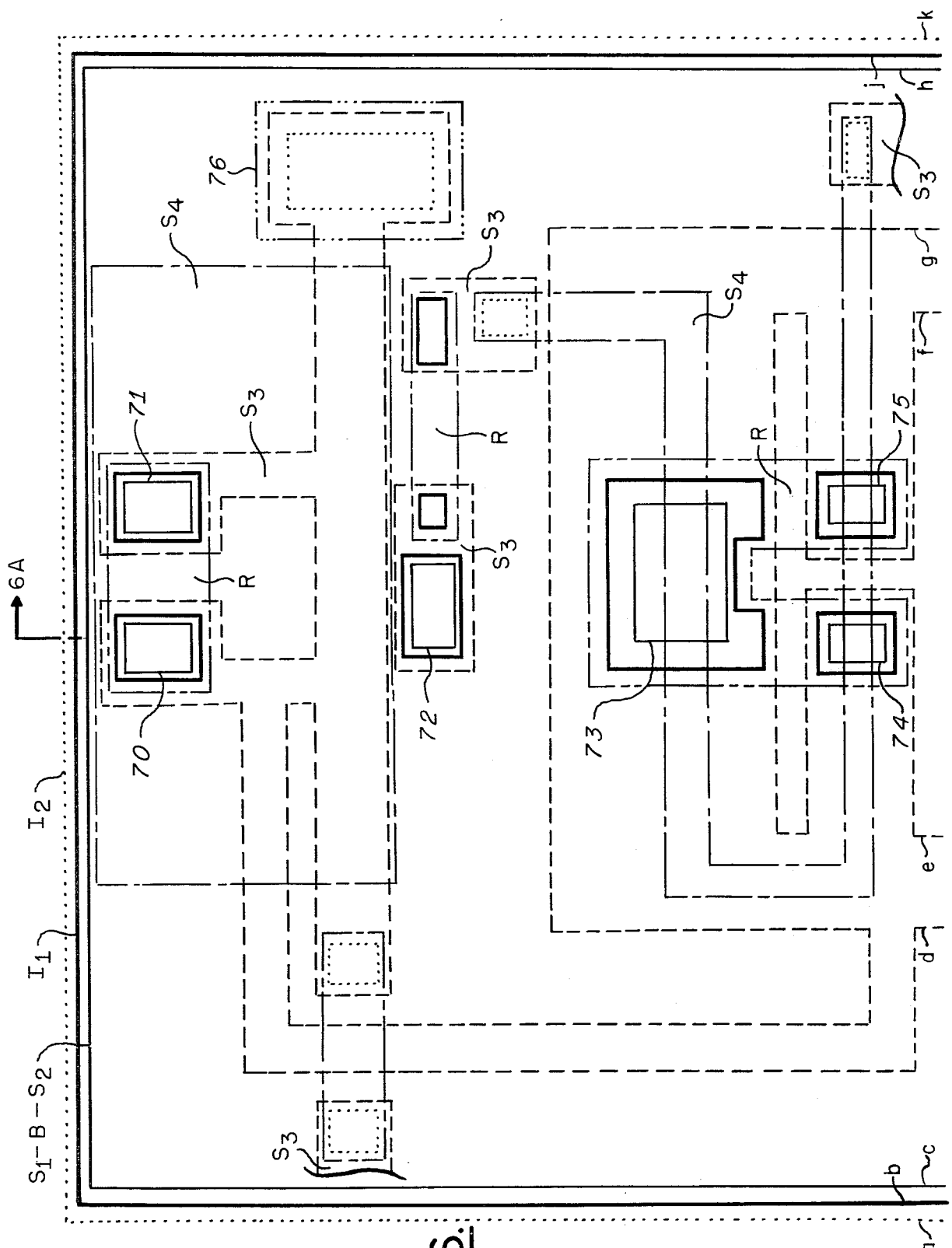
FIG. 6 is a schematic representation of the layers and steps utilized in fabricating an interferometer and asymmetric injection gate in accordance with the present invention utilizing the local anodization technique of said Ser. No. 179,311.
Figure 6:
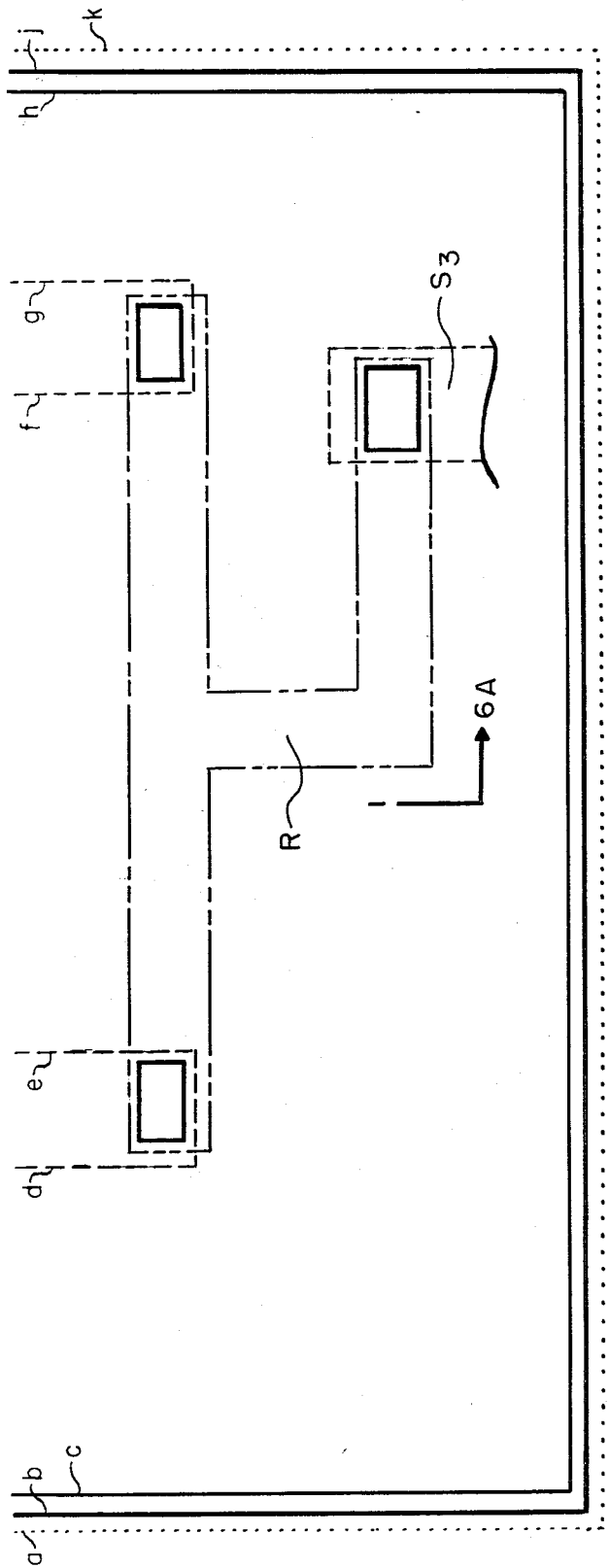

Details of the conventional arrangement and fabrication of the 1:2:1 interferometer may be had from said Reference 2 particularly with respect to the schematic illustration thereof in FIG. 6 on page 133 of Reference 2. It is noted that the counterelectrode (the third of the four superconducting layers) is the layer that makes contact with the groundplane. The circuit model of the 1:2:1 interferometer is illustrated in FIG. 7B on page 134 of said Reference 2, and illustrates that the third superconducting layer is connected to the groundplane. In the present invention, the counterelectrode and the groundplane constitute the same layer.

The prior art two-junction asymmetric injection gate is illustrated in FIG. 10A on page 135 of said Reference 2, depicting the structure of this gate fabricated utilizing conventional lead alloy processing. The equivalent circuit for the gate is illustrated in FIG. 10B on page 135 of said Reference 2. The embodiments of the present invention eliminate two deposition steps and two patterning steps with respect to the prior art structures and processing. The present invention combines the groundplane and one of the Josephson electrodes into one layer and particularly the Josephson lower electrode is incorporated with the groundplate. The present invention thus eliminates one layer of superconductor and the associated insulator layer. In order to implement the processor of the present invention, the sequence of various layers has been altered compared to the conventional processing described in said Reference 2. In particular, the 1:2:1 interferometers are constructed "upside down".

Figure 4A:
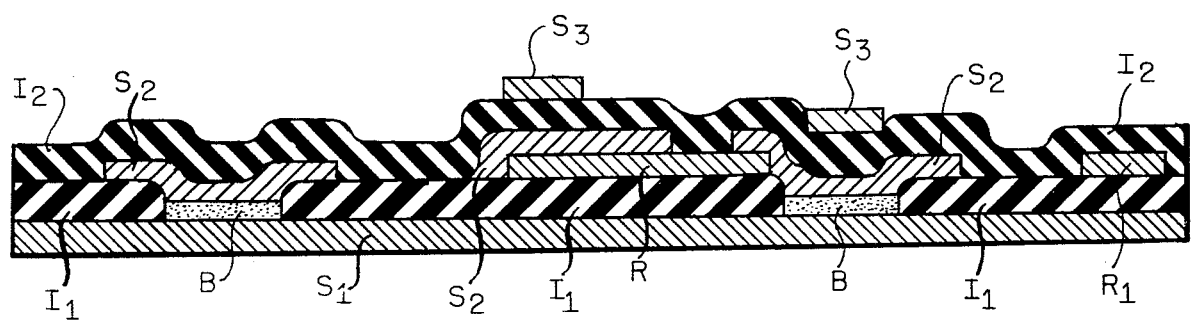
FIG. 4A is a cross section of the integrated circuit of FIG. 4 taken along line 4A.
Figure 1B:
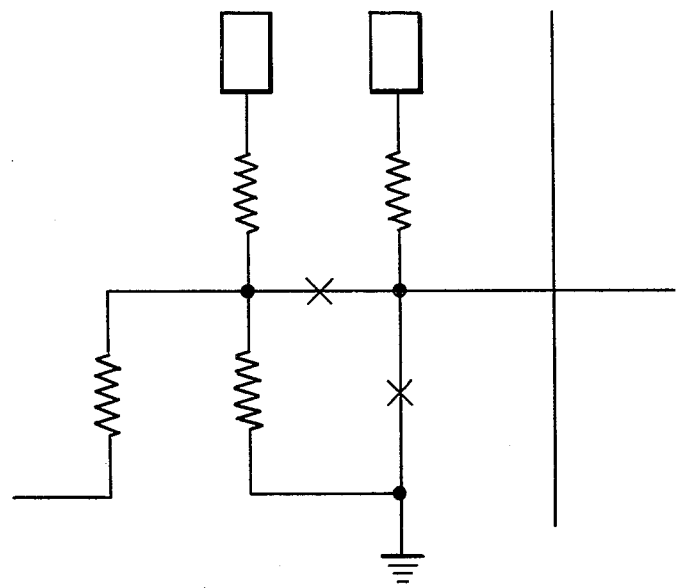
FIG. 1B is a schematic wiring diagram of the JAWS gate of FIG. 1.
Figure 3B:
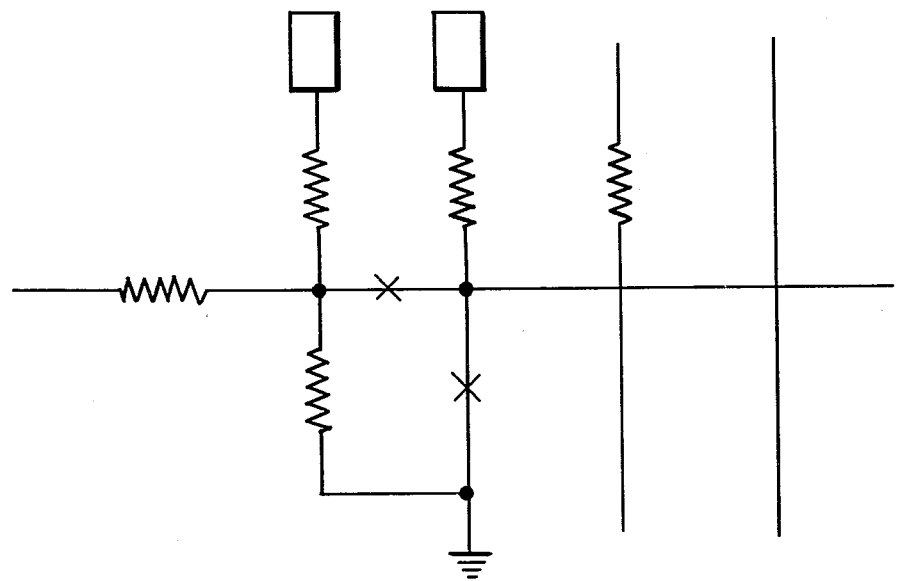
FIG. 3B is a schematic wiring diagram of the JAWS gate of FIG. 3.
Figure 4:
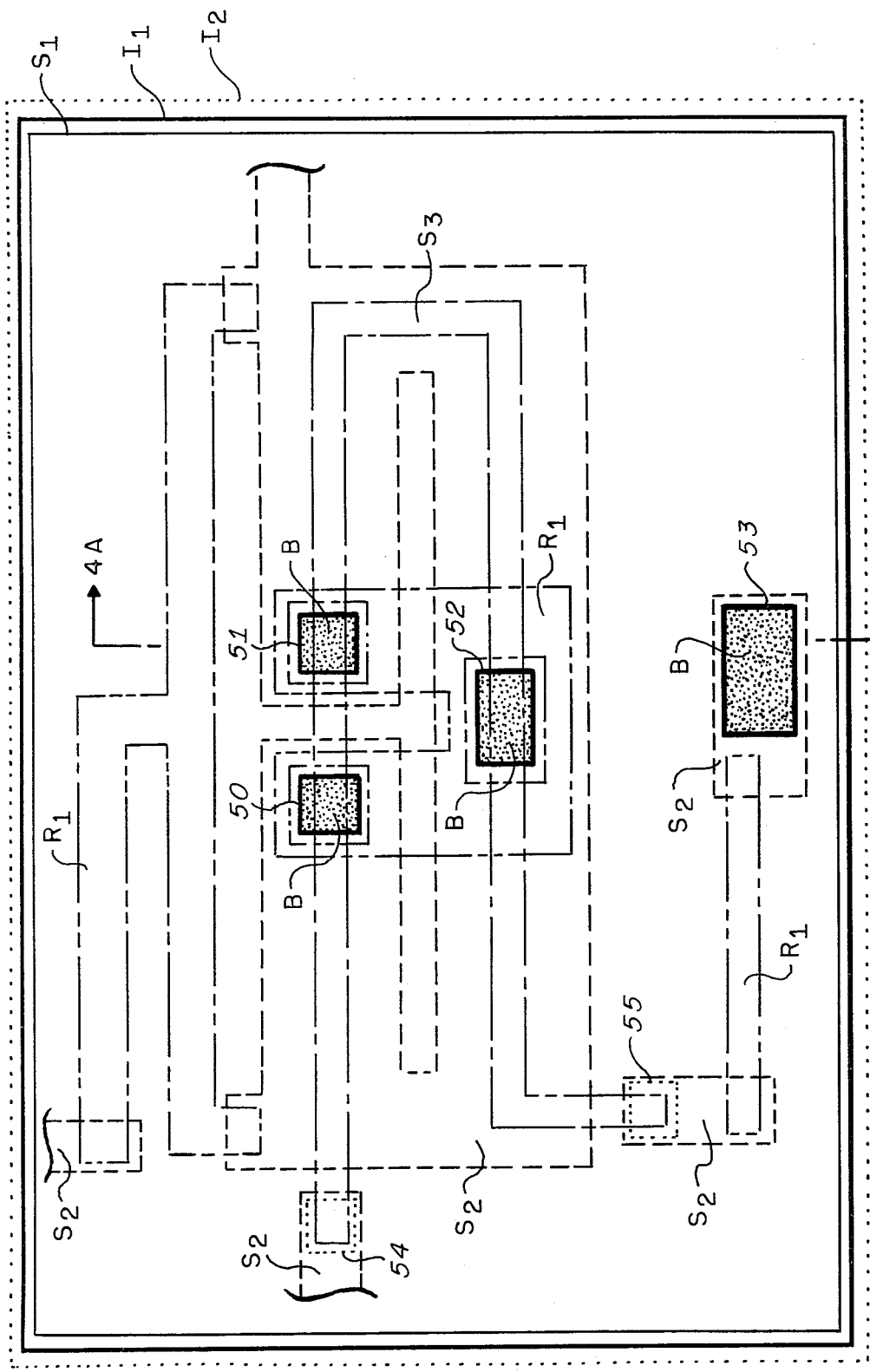
FIG. 4 is a schematic representation of the layers and steps utilized in fabricating a 1:2:1 interferometer in accordance with the present invention.

Referring to FIG. 4, a 1:2:1 interferometer fabricated in accordance with the present invention is illustrated. FIG. 4A depicts a cross section through the integrated circuit of FIG. 4 as indicated by the line 4A. The layers and steps utilized in fabricating the Josephson junction integrated circuit of FIG. 4 is summarized as follows:

TABLE 4

| Layer | Material | Function |
|---|---|---|
| $S_1$ | Superconductor (2500 Å) | Form groundplane and lower Josephson junction electrodes |
| $I_1$ | Insulator(2500 Å) | Groundplane insulation and Josephson junction openings |
| $R_1$ | Resistor 800 Å | Damping, power and terminating resistors |
| B | Oxide, deposited semiconductor (30–100 Å) | Form Josephson tunneling barrier |
| $S_2$ | Superconductor (3000 Å) | Form Josephson junction counterelectrodes, inductive loops, strip transmission lines, buses |
| $I_2$ | Insulatoor (3500 Å) | Control line insulation |
| $S_3$ | Superconoductor (4000 Å) | Control lines, flux shields |

Each of the layers and vias for Josephson junction definition are formed utilizing processes known in the art.

Each of the deposition steps except deposition of the barrier is followed by a patterning step, either lift-off or subtractive etching, depending upon the system of materials utilized. The letters of the legend of FIG. 4 designating the layers correspond to those delineated in Table 4.

A superconductive layer $S_1$ is deposited onto a substrate which typically comprises an oxided silicon wafer. The layer $S_1$ forms the groundplane for the circuit and the lower Josephson junction electrodes for the junctions of the interferometer. $S_1$ corresponds to the counter electrode and the groundplane of FIG. 6 on page 133 of said Reference 2. The superconductive layer $S_1$, if niobium, may or may not be anodized where the purpose of anodization is to form a thin (approximately 350 Angstrom units) layer of high quality, pinhole free, insulation. The $S_1$ layer is also useful for forming matching capacitors, a circuit refinement useful in realizing the fastest switching times and reliable performance. The second step is the deposition of an insulator layer $I_1$ which is patterned to form openings defining the Josephson junctions as well as large area openings defining large area Josephson junctions wherever electrical contacts to the groundplane are required. The $I_1$ step may be effected utilizing insulator deposition and subtractive etching or by forming a photoresist mask for lift-off followed by the insulator deposition and lift-off by dissolving the photoresist. For example, deposition and subtractive etching may be effected by sputter depositing silicon dioxide following by etching with buffered hydrofluoric acid. The photoresist mask technique may be implemented by utilizing evaporated silicon oxide. If the $S_1$ layer had been anodized, the anodization must be removed in the $I_1$ vias. For example, if $S_1$ is anodized niobium, the $Nb_2O_5$ must be etched away in the $I_1$ vias or, alternatively, the anodization blocked therein by a photoresist pattern. Vias 50, 51 and 52 are the Josephson junction openings in the $I_1$ layer for the interferometer whereas the via 53 is utilized for effecting contact to the groundplane $S_1$ by means of a large area Josephson junction.

The third step of the process comprises forming resistors $R_1$ including damping resistors, strip transmission line terminating resistors and feed resistors. The damping resistors surround the Josephson junction openings to form low inductance contacts to the Josephson junctions. The resistors may be fabricated by deposition through a lift-off photo mask typically utilizing evaporated indium-gold alloy or by deposition followed by subtractive etching through a photo mask which, for example, may involve deposited molybdenum etched in a carbon tetrafluoride 8% oxygen plasma. Depending on the circuit, it may be desirable to perform the resistor fabrication step before the vias in the $I_1$ layer are formed, thus preventing exposure of the surface of the bottom electrode of the Josephson junctions to any unnecessary processing.

The fourth step of the process is the formation of the Josephson tunneling barriers. The barriers may comprise native oxide or may be deposited barriers such as amorphous hydrogenated silicon. The barriers are denoted as B and are defined by the openings 50, 51, 52 and 53 in the insulator layer $I_1$. The barrier formation is followed by the deposition of a superconductive layer $S_2$ forming the Josephson junction upper electrodes. The formation of the $S_2$ layer may be effected by any of a variety of known techniques such as those discussed above. The $S_2$ layer is patterned to form the inductive loops of the interferometer as well as any required strip transmission line interconnections. The $S_2$ layer thus forms inductances $L_m$ and $L_k$ on FIG. 7b on page 134 of said Reference 2. The $S_2$ layer also forms the large area Josephson junction contacts to the groundplane layer $S_1$ such as that effected through the via 53.

As discussed above, the method of contacting the groundplane through a large area Josephson junction adds insignificant inductance to the groundplane contact. The amount of inductance added to the circuit by the large area Josephson junction is typically smaller than the stray inductances prevalent in conventional Josephson interferometers and should not present a serious problem for circuit operation. As discussed, the technique of utilizing the large area Josephson junction contact, however, results in the disadvantage that the contacts to the groundplane are approximately ten times larger in area than the Josephson junctions of the interferometer in order to achieve the desired critical current margins. This is, however, a small area requirement relative to the size of the entire interferometer.

The fifth step in the process is the deposition of an insulator layer $I_2$ with via openings where required. Such vias may be utilized for control line to strip transmission line contacts and control line to terminating resistor contacts. Two such vias are designated by reference numerals 54 and 55. The seventh step in the process comprises deposition and patterning of a superconductive layer $S_3$ comprising the superconducting control lines for the circuit. The control lines $S_3$ contact the circuit through the vias 54 and 55. For simplicity only one control line is illustrated whereas actual circuits require two or more control lines. The multiple control lines may be deposited and patterned simultaneously.

The fabrication process described with respect to FIG. 4 and Table 4 utilizes six deposition steps (six photoresist/etching steps) in addition to barrier formation. An anodization step with respect to the $S_1$ layer may also be included. As appreciated from said Reference 2, as discussed above, the present invention provides a considerable simplification with respect to the conventional processing for similar circuits. It is appreciated that the resulting structure of FIG. 4 is substantially the circuit depicted by the schematic equivalent diagram of FIG. 7b on page 134 of said Reference 2, with the exception that some of the parasitic capacitances and inductances may be slightly different. There are, however, a number of techniques commonly utilized in the fabrication of conventional Josephson integrated circuits to modify these values. Such techniques include the use of additional insulator layers to increase inductance or forming holes in the groundplane for increasing inductance. Capacitors may be formed under the strip transmission lines to provide an impedance match in regions of unavoidable increased inductance. It will be appreciated that although contact pads are not illustrated in FIG. 4, the $S_1$ layer should be removed beneath any contact pads for the reasons discussed above with respect to FIGS. 2 and 3.

It will be appreciated from a comparison between FIG. 4 and FIG. 2 that current injection gates are simpler to fabricate than magnetically controlled gates because current injection gates do not require control lines. The fastest logic, however, at the current state of the technology, utilizes a combination of magnetically controlled interferometers and current injection gates. Thus, it is useful to fabricate current injection gates in conjunction with interferometers utilizing a compatible process for the two. Specifically the sequence of steps discussed above with respect to FIG. 4 and Table 4 may be utilized for simultaneously fabricating current injection gates on the same chip.

Figure 5:
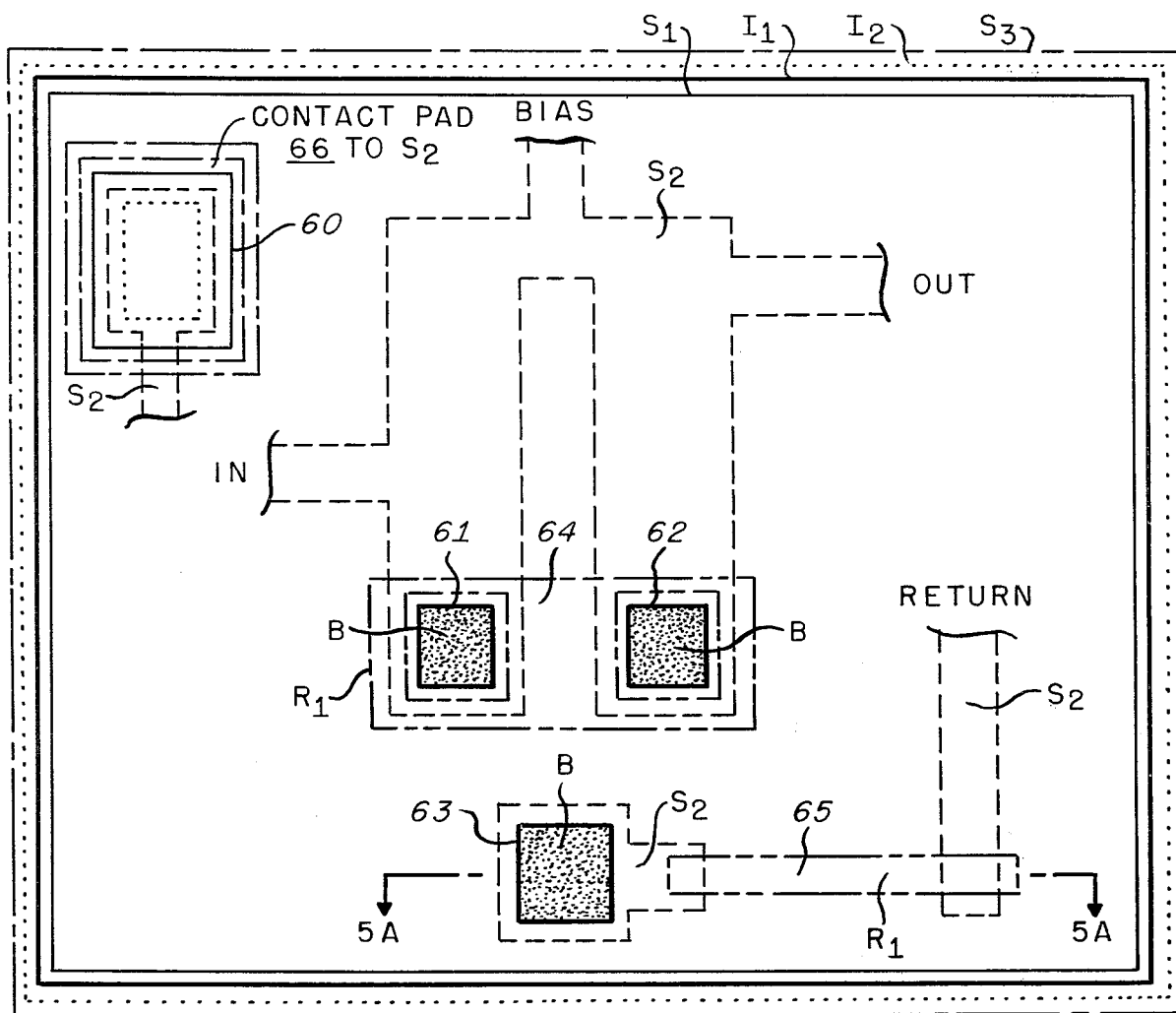
FIG. 5 is a schematic representation of the layers and steps utilized in fabricating an asymmetric current injection gate in accordance with the present invention.
Figure 5A:
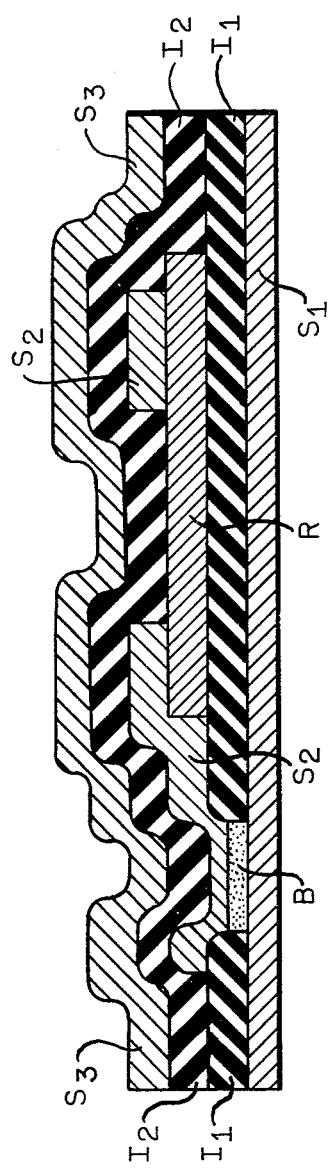
FIG. 5A is a cross section of the integrated circuit of FIG. 5 taken along line 5A.

For purposes of example, FIG. 5 illustrates a two junction asymmetric current injection gate which may be fabricated utilizing identically the sequence of steps and methods of deposition and patterning as discussed above with respect to FIG. 4. The details of the process discussed above with respect to FIG. 4 and Table 4 are applicable to FIG. 5. FIG. 5A illustrates a cross section taken through the line 5A of FIG. 5. The letter designations of the legend of FIG. 5 correspond to those delineated in Table 4.

Step 1 comprises depositing and patterning the $S_1$ layer. For the asymmetric injection gate, per se, the $S_1$ layer does not require patterning. This layer, however, should be removed underneath external contact pads for the reasons discussed above. The removal of the $S_1$ layer beneath a contact pad is indicated by reference numeral 60. In practical circuits holes may be formed in the $S_1$ layer to increase inductance values or to form on-chip transformers as part of the power supply arrangement. The next step constitutes deposition of the $I_1$ insulator layer and patterning the $I_1$ layer to form vias 61, 62 and 63. The two small opening vias 61 and 62 define the Josephson junctions of the gate and the large opening via 63 provides a contact to the Josephson base electrode and groundplane $S_1$ via a large area Josephson junction. The next step comprises depositing and patterning resistor material to form a damping resistor 64 and a terminating resistor 65. In a manner similar to that discussed with respect to FIG. 4, the damping resistor 64 forms a "ring" around the Josephson openings. In the next step of the process the Josephson barriers are formed in the vias 61, 62 and 63 followed by the step of depositing and patterning the Josephson counterelectrode superconductive layer $S_2$. The $S_2$ layer not only forms the Josephson counterelectrode for the asymmetric gate, but a requisite inductive loop and connecting strip transmission lines.

Following the formation and patterning of the $S_2$ layer the injection gate is essentially complete. Another insulator layer and superconductive layer are, however, necessary to complete the interferometer portion of the circuit illustrated and discussed above with respect to FIG. 4. These layers may be deposited over the injection gate of FIG. 5 where the superconductive layer will provide a flux shield for the gate. Thus the last two steps of the process comprises depositing and patterning the insulator layer $I_2$ and depositing and patterning the superconductive layer $S_3$. It is appreciated that the insulator layer $I_2$ is unpatterned except over contact pads. An island is formed in the $S_3$ layer to provide external contact to the $S_2$ layer of the gate. This contact pad is designated by reference numeral 66.

It is desirable to utilize a flux shield over the gate of FIG. 5 since any magnetic flux that penetrates the superconducting loop or junctions forming the gate can be deleterious to the operation of the circuit. The unpatterned portion of the $S_3$ layer forms a superconducting barrier to the penetration of flux into the gate. Since this layer is required to complete the interferometer of FIG. 4, fabricating the flux shield does not increase the number of steps.

It is appreciated that the circuit of FIG. 5 conforms to the equivalent circuit of FIG. 10A on page 135 of said Reference 2. The parasitic parameter values of the circuit of FIG. 5 will be different from those of circuits conventionally fabricated. In particular, the inductance of any line passing over a region where no groundplane exists will be increased slightly. Thus in the circuit exemplified in FIG. 5 there may be an increase in the stray inductance thereof. This increase in stray inductance may decrease margins and performance slightly compared to prior art circuits but the loss in these factors may be regained because of the simpler fabrication provided by the present invention.

Referring now to FIG. 6, an integrated circuit chip is illustrated containing the 1:2:1 interferometer and the asymmetric two junction injection gate fabricated in accordance with the invention and utilizing the local anodization technique of said Ser. No. 179,311 to define the junction areas. The layers and steps utilized in fabricating the circuit of FIG. 6 is summarized as follows:

TABLE 5

| Layer | Material | Function |
|---|---|---|
| $S_1$ | Niobium 3000 Å | Josephson lower electrode/groundplane |
| B | Oxide, deposited semiconductor (30–100) Å | Tunneling Barrier |
| $S_2$ | Niobium (200–600) Å | Josephson upper electrode |
| A | Anodized niobium (600–1800) Å | Josephson junctions are delineated by local anodization, layer $S_1$-B-$S_2$-A is then patterned as a whole |
| R | Molybdenum 800 Å | Damping, power and terminating resistors |
| $I_1$ | $SiO_2$ 2500 Å | Groundplane insulator. Vias to resistors, Josephson junctions |
| $S_3$ | Niobium 3000 Å | Strip transmission lines, inductive loops contacts to resistors and Josephson junctions |
| $I_2$ | $SiO_2$ 3500 Å | Control line insulation |
| $S_4$ | Niobium 4000 Å | Control lines, flux shields |

$S_1$-B-$S_2$ are deposited sequentially with no intervening patterning steps. The processing for the integrated circuit of FIG. 6 is initiated by constructing the $S_1$-B-$S_2$ trilayer in accordance with said Ser. No. 179,311. Firstly a film of niobium approximately 3000 Angstrom units thick is deposited followed by the Josephson barrier formation. Typically plasma or thermal oxidation or deposition of a semiconductor material is utilized to form the barrier layer. The upper layer of the trilayer structure is formed by deposition of a thin layer of niobium approximately 200 to 600 Angstrom units thick. After this sequence is completed, the substrate is covered by essentially one continuous Josephson junction. The three layers may be completed in situ without removing the substrate from the vacuum chamber. The fabrication of the trilayer proceeds without any intervening processing or patterning steps. It is thus appreciated that the Josephson junctions are formed on a clean unpatterned, undamaged and uncontaminated surface. This procedure provides Josephson junctions with superior properties relative to junctions formed with more conventional procedures. When barriers are deposited utilizing chemical vapor deposition, it is crucial to deposit the barrier on an unpatterned surface.

The first step after formation of the trilayer (step 1 of FIG. 6) comprises forming a pattern in photoresist over the desired junction areas and then anodizing completely through the $S_2$ layer. In this one step not only are the junctions defined, but a layer of high quality insulator is formed over the $S_1$ layer. It is appreciated that the $S_1$ layer will form the groundplane for the circuit of FIG. 6 as well as the lower Josephson electrodes. Specifically during step 1 of FIG. 6, photoresist is formed within rectangles 70, 71, 72, 73, 74 and 75. After anodization the areas within the rectangles 70–75 have trilayer junction structures and over the remainder of the substrate, the $S_2$ niobium layer has been completely anodized to niobium oxide. It is appreciated that following this step of the process it would only be necessary to deposit and pattern a superconducting layer over the unanodized junction areas to determine the electrical characteristics of the Josephson junctions. Thus at the beginning of the process it is possible to determine the quality of the most critical elements in the process. The results of such a test may then be utilized to abort the process or to modify the junction areas on the process wafers in order to achieve design values of critical current.

In step 2, the multilayer $S_1$-B-$S_2$-A is patterned to remove those areas of the multilayer over which contact pads are to be formed. For example, the multilayer is removed within the rectangle 76. The reason for removing the multilayer under the contact pad has been discussed above with respect to FIGS. 2 and 3. The next step comprises depositing and patterning the resistor material, which typically may be molybdenum, approximately 800 Angstrom units thick. The resistors R are deposited only over planar regions thus obviating the step coverage problem sometimes prevalent in conventional processes. The next step in the process comprises depositing the $I_1$ insulator layer patterned to form vias to the Josephson junctions and to the resistors R. Typically the $I_1$ layer comprises silicon dioxide approximately 2500 Angstrom units thick. The $I_1$ layer also insulates the patterned edges of $S_1$-B-$S_2$-A and provides additional low dielectric constant groundplane insulation for the superconducting strip transmission lines to be subsequently formed in the $S_3$ layer.

In the next step of the process, the $S_3$ superconductive layer is deposited and patterned to form strip transmission lines, inductive loops and groundplane contacts through previously formed large area Josephson junctions. The $S_3$ layer is preferably composed of niobium approximately 3000 Angstrom units thick. The $S_3$ layer thus completes the two junction asymmetric injection gate by coupling the Josephson junction areas 70 and 71 and providing an external contact pad at 76. The $S_3$ layer also completes the three junction interferometer by intercoupling the junctions formed in the rectangles 73, 74 and 75 connecting the appropriate points to the groundplane via the large area Josephson junction within the rectangle 72.

In the next step of the process an insulator layer $I_2$ is deposited and vias are patterned for contacts to the $S_4$ layer to be subsequently deposited. A via is also patterned in the $I_2$ layer for contact to the pad at 76. The $I_2$ layer preferably comprises silicon dioxide approximately 3500 Angstrom units thick. The $S_4$ superconductive layer is next deposited and patterned to form the control lines over the interferometer and the flux shield over the injection gate.

As discussed above, refinements to the circuit may be effected with respect to performance or size by conventional techniques. Matching capacitors may be fabricated by utilizing appropriate cutouts in the $I_1$ layer underneath the strip transmission lines and additional inductance may be obtained in superconducting loops by adding insulator thickness or groundplane cutouts. It will be appreciated that the circuits formed in FIG. 6 are precisely the required circuits and can be designed with desired parameter values. Although some of the various stray capacitances and inductances will be different with respect to a comparable circuit fabricated using a conventional process, these differences can be accommodated by utilizing the circuit refinements discussed above.

It will be appreciated from the foregoing described embodiments of the invention that the present processes eliminate a significant number of steps compared to the prior art processes. This results in significantly greater yields of acceptable circuits and considerably shortens the time required to complete circuit fabrication. The resultant circuits are identical in all essential ways to conventionally fabricated circuits. All significant circuit parameters are virtually identical to those of circuits fabricated utilizing conventional processes. All significant types of Josephson logic circuits may be implemented utilizing the processes herein disclosed. Josephson circuits comprising all refractory materials may be fabricated utilizing the processes of the present invention. When utilizing the embodiments of FIGS. 2 and 3, there are no steps following junction counter-electrode deposition and patterning except for a possible passivation layer. This is of considerable importance when implementing lead alloy Josephson technology since lead alloys junctions may be degraded by subsequent processing. With respect to the embodiments of FIGS. 4, 5 and 6, the number of steps following junction formation is identical or less compared with conventional processing again providing an advantage when utilizing the invention with lead alloy junctions.

The invention provides the advantage of forming resistors on planar surfaces. Thus relatively thin resistors may be utilized without problems with step coverage and without creating subsequent step coverage problems. The present invention utilizes large area Josephson junctions to form superconducting contacts. Alternatively superconducting shorts could be formed with the disadvantage of an additional patterning step to remove the barrier in these areas.

In addition to the above advantages, when the present invention is utilized in conjunction with local anodization to form the Josephson junctions, the following advantages are obtained. The tunneling barriers are formed on a fresh unprocessed surface. The junction characteristics are dependent upon the quality of the superconductor at the barrier-superconductor interface to a depth of the superconducting coherence length, which in niobium is typically approximately 80 Angstrom units. Thus the present process that permits junction fabrication on an unprocessed surface is generally advantageous with respect to prior art processes that do not provide this feature.

By depositing the initial Nb-barrier-Nb trilayer on an additional substrate and processing this substrate into individual Josephson junctions (a short process relative to processing for a full logic circuit), the junction parameters can be obtained. Based upon these parameters the logic fabrication can be aborted, continued, or modified, thus, increasing yield and/or productivity. For example, based upon the junction critical current obtained on the test wafer, the logic chip can be processed untilizing a different size Josephson junction, thus obtaining the correct design value for the critical current, or the resistance values can be modified to ensure proper circuit operation.

The resistors are fabricated directly on top of the anodized niobium but underneath the first layer of deposited insulator, whereas in conventional processing the resistors are deposited on top of both of these layers. This configuration leads to lower inductances associated with the resistors which is advantageous for circuit performance. The present arrangement also permits the use of resistors as crossovers. Furthermore, resistors and strip transmission lines can be fabricated on the same substrate areas permitting very efficient utilization of available area if the degradation of the strip transmission line characteristics can be tolerated. The first layer of deposited insulator provides several functions. The layer forms vias to the Josephson junctions, the resistors and to the groundplane contacts. The layer provides an etch stop for the upper niobium etch step. The layer provides additional groundplane insulation of desirably low dielectric constant and functions as the insulator for the edges patterned on the first superconductor layer.

Capacitors can be formed with no additional fabrication steps, by holes in the deposited insulator down to the anodized niobium. These capacitors can be utilized at crossovers to match the strip transmission line impedance.

It will be appreciated with respect to the above described embodiments that generally only representative elements are included to illustrate the concepts of the invention with respect to these elements. In practical circuits numerous such elements will be utilized. It will be appreciated with respect to the above described embodiments of the invention that the layer thicknesses specified are exemplary, other thicknesses being useful in practicing the invention.

Although the present invention was described above in terms of Josephson Tunnel Junction devices, it is appreciated that the invention is applicable to superconductive tunnel junction devices that do not utilize the Josephson effect. Additionally, the structural configurations and processing procedures described herein above are applicable to superconductive devices wherein the conduction mechanism through the barrier is not predominently or necessarily tunneling.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A superconductive integrated circuit including at least one superconductive tunnel junction, said tunnel junction including first and second tunnel junction electrodes superposed with respect to each other with a superconductive tunneling barrier therebetween for conducting superconductive tunneling current between said first and second tunnel junction electrodes, said integrated circuit comprising,
   a first layer of superconductive material, said first layer including said first tunnel junction electrode, and
   a second layer of superconductive material superposed with respect to first layer, said second layer including said second tunnel junction electrode, one of said first and second layers of superconductive material forming a ground plane for said integrated circuit as well as forming said tunnel junction electrode included therein.

2. The integrated circuit of claim 1 in which said superconductive tunnel junction comprises a Josephson tunnel junction and said superconductive tunneling barrier comprises a Josephson tunneling barrier for conducting Josephson tunneling current between said first and second tunnel junction electrodes.

3. The integrated circuit of claim 2 in which said first layer of superconductive material forms said ground plane for said integrated circuit as well as forming said first tunnel junction electrode included therein.

4. The integrated circuit of claim 3 in which said first layer of superconductive material is patterned to form an island therein.

5. The integrated circuit of claim 4 in which said island contains said first tunnel junction electrode of said Josephson tunnel junction.

6. The integrated circuit of claim 3 including a large area Josephson junction having a lower electrode in said first layer of superconductive material, an upper electrode in said second layer of superconductive material and a large area tunneling barrier therebetween, said area of said large area Josephson junction being of such extent that said large area Josephson junction has a critical current so as to remain at zero voltage throughout the range of current loadings of said junction encountered in use of said integrated circuit whereby zero resistance contact is effected from said second layer of superconductive material to said first layer of superconductive material by means of said large area Josephson junction throughout said range of current loadings.

7. The integrated circuit of claim 6 in which said first layer of superconductivve material is patterned to form an island therein, said island containing said lower electrode of said large area Josephson junction.

8. The integrated circuit of claim 7 in which said second layer of superconductive material is patterned to form first, second and third lines, said first line traversing said island with said second and third lines disposed on opposite sides of said first line respectively and not making electrical contact therewith, said island containing two large area Josephson junctions on opposite sides of said first line respectively, said second and third lines providing the upper electrodes for said large area Josephson junctions respectively, so as to form a crossover of said second and third lines with respect to said first line, whereby zero resistance electrical continuity is provided between said second and third lines through said large area Josephson junction and through said island throughout said range of current loadings.

9. The integrated circuit of claim 3 further including a first layer of insulative material between said first and second layers of superconductive material, said first layer of insulative material having an opening therethrough, said Josephson tunneling barrier being formed in said opening.

10. The integrated circuit of claim 6 in which said Josephson tunnel junction comprises a small area Josephson junction having said lower electrode thereof in said first layer of superconductive material and said upper electrode thereof in said second layer of superconductive material and a small area tunneling barrier therebetween, said area of said small area Josephson junction being of such extent that said small area Josephson junction has a critical current so as to be switchable between zero voltage and non-zero voltage at the current loading of said junction encountered in the use of said integrated circuit, said integrated circuit including a first layer of insulative material between said first and second layers of superconductive material, said first insulative layer having openings therethrough, said small area barrier and said large area barrier being formed in said openings.

11. The integrated circuit of claim 3 in which said second layer of superconductive material includes contact pads, said first layer of superconductive material being removed beneath said contact pads.

12. The integrated circuit of claim 9 including a layer of resistive material deposited over said first layer of insulative material and beneath said second layer of superconductive material, said layer of resistive material being patterned to form resistors for said integrated circuit.

13. The integrated circuit of claim 3 including a barrier layer between said first and second layers of superconductive material, said barrier layer including said Josephson tunneling barrier, said circuit including a plurality of Josephson tunnel junctions having respective lower Josephson junction electrodes in said first layer of superconductive material and respective upper Josephson junction electrodes in said second layer of superconductive material with respective tunneling barriers therebetween, said tunneling barriers being in said barrier layer, said second layer of superconductive material being anodized through to said barrier layer except at the locations of said Josephson tunnel junctions, said first and second layers of superconductive material with said barrier layer therebetween and with said second superconductive layer anodized therethrough comprising a trilayer.

14. The integrated circuit of claim 13 including a third layer of superconductive material superposed with respect to said second layer of superconductive material and making electrical contact therewith.

15. The integrated circuit of claim 13 in which said trilayer is patterned to form an island therein.

16. The integrated circuit of claim 15 in which said island contains at least one said Josephson tunnel junction.

17. The integrated circuit of claim 14 in which said plurality of Josephson tunnel junctions include a large area Josephson junction having a lower electrode in said first layer of superconductive material, an upper electrode in said second layer of superconductive material and a large area tunneling barrier in said barrier layer, the area of said large area Josephson junction being of such extent that said large area Josephson junction has a critical current so as to remain at zero voltage throughout the range of current loadings of said junction encountered in use of said integrated circuit, said third superconductive layer contacting said first superconductive layer through said large area Josephson junction.

18. The integrated circuit of claim 17 in which said trilayer is patterned to form an island therein, said island containing said large area Josephson junction.

19. The integrated circuit of claim 18 in which said third layer of superconductive material comprises first, second and third lines, said first line traversing said island with said second and third lines disposed on opposite sides of said first line respectively and not making electrical contact therewith, said island containing first and second large area Josephson junctions on opposite sides of said first line respectively, said second and third lines contacting the upper electrodes of said first and second large area Josephson junctions respectively, so as to form a crossover between said first line and said second and third lines whereby zero resistance electrical continuity is provided between said second and third lines through said large area Josephson junctions and through said island throughout said range of current loadings.

20. The integrated circuit of claim 14 including a layer of resistive material deposited between said trilayer and said third layer of superconductive material, said layer of resistive material being patterned to form resistors for said integrated circuit.

21. The integrated circuit of claim 20 further including a layer of insulative material deposited between said layer of resistive material and said third superconductive layer, with holes through said insulative layer for contact between said third superconductive layer and said resistors.

22. The integrated circuit of claim 21 in which said third superconductive layer includes a first line traversing a resistor of said resistive layer and further includes second and third lines on opposite sides of said first line respectively, and not making electrical contact therewith, with openings in said insulative layer for contact between said second and third lines and said resistor traversed by said first line so as to form a crossover between said first line and said second and third lines whereby electrical continuity is provided between said second and third lines through said resistor.

23. The integrated circuit of claim 9 further including a third layer of superconductive material superposed with respect to said second layer of superconductive material, said third layer of superconductive material being patterned to form control lines for said integrated circuit.

24. The integrated circuit of claim 23 including a second layer of insulative material between said second and third layers of superconductive material with openings therethrough for effecting contact between said second and third superconductive layers.

25. The integrated circuit of claim 9 further including a third layer of superconductive material superposed with respect to said second layer of superconductive material for providing a flux shield for said integrated circuit.

26. The integrated circuit of claim 25 further including a second layer of insulative material between said second and third layers of superconductive material.

27. The integrated circuit of claim 14 further including a fourth layer of superconductive material superposed with respect to said third layer of superconductive material, said fourth layer of superconductive material being patterned to form control lines for said integrated circuit.

28. The integrated circuit of claim 27 including a layer of insulative material between said third and fourth layers of superconductive material with openings therethrough for effecting contact between said third and fourth layers of superconductive material.

29. The integrated circuit of claim 14 further including a fourth layer of superconductive material superposed with respect to said third layer of superconductive material for providing a flux shield for said integrated circuit.

30. The integrated circuit of claim 29 including a layer of insulative material between said third and fourth superconductive layers.

* * * * *